United States Patent
Wang et al.

(10) Patent No.: US 7,821,083 B2
(45) Date of Patent: Oct. 26, 2010

(54) SEMICONDUCTOR DEVICE AND METHOD FOR MANUFACTURING THE SAME

(75) Inventors: Wenwu Wang, Beijing (CN); Wataru Mizubayashi, Tokyo (JP); Koji Akiyama, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 216 days.

(21) Appl. No.: 12/137,796

(22) Filed: Jun. 12, 2008

(65) Prior Publication Data

US 2008/0308865 A1  Dec. 18, 2008

(30) Foreign Application Priority Data

Jun. 15, 2007  (JP)  .............................. 2007-158383

(51) Int. Cl.
  *H01L 27/88*  (2006.01)
(52) U.S. Cl. ...................... 257/410; 257/334; 257/344; 257/350; 257/408
(58) Field of Classification Search ................. 438/288; 257/245
  See application file for complete search history.

(56) References Cited

U.S. PATENT DOCUMENTS

2009/0065873 A1 *  3/2009  Park et al. .................... 257/372

FOREIGN PATENT DOCUMENTS

| JP | 2003-158262 A | 5/2003 |
|---|---|---|
| JP | 2005-19891 A | 1/2005 |
| JP | 2005-72490 A | 3/2005 |
| JP | 2005-150737 A | 6/2005 |
| JP | 2005-277318 A | 10/2005 |
| JP | 2006-41306 A | 2/2006 |
| WO | 2005038929 A1 | 4/2005 |

OTHER PUBLICATIONS

Japanese Office action for 2007-158383 dated Sep. 15, 2009.

* cited by examiner

*Primary Examiner*—N Drew Richards
*Assistant Examiner*—Kyoung Lee
(74) *Attorney, Agent, or Firm*—Pearne & Gordon LLP

(57) ABSTRACT

A semiconductor device includes a structure of a gate electrode/a high-k dielectric insulating film containing aluminum and having a dielectric constant greater than that of a silicon oxide film/the silicon oxide film/a silicon substrate, and is provided with a diffusion layer formed by diffusing an aluminum atom or an aluminum ion to the silicon oxide film or an interface between the silicon oxide film and the silicon substrate by a heat treatment. A laminated film or a mixed film of hafnium oxide and aluminum oxide having a ratio of hafnium and aluminum ranging from about 2:8 to 8:2 is used as the high-k dielectric film. The heat treatment is performed at any temperature from about 500 to 1000° C. for any period of time from about 1 to 100 seconds.

5 Claims, 5 Drawing Sheets

(a)

(b)

(a)　　　(b)

(a)     (b)

DIFFUSING Al BY PDA
(PDA:post Al₂O₃ deposition annealing)

pMOS (a)                            (b)

(c)

SEMICONDUCTOR DEVICE AND METHOD FOR MANUFACTURING THE SAME

FIELD OF THE INVENTION

The present disclosure relates to a semiconductor device and a method for manufacturing the same, and more particularly, to a micro-MOSFET (metal-oxide-semiconductor field-effect transistor) having a structure capable of stably controlling a threshold value of the transistor, and a method for manufacturing the same.

BACKGROUND OF THE INVENTION

The integration density of an integration circuit has been remarkably improved each year due to the miniaturization of a transistor and the like. In case of an integration circuit adopting a MOSFET, such miniaturization of the transistor can promote the miniaturization of components of the transistor according to a proportional reduction rule. However, it is known that a short channel effect of the transistor may occur as the miniaturization is progressed.

For example, if a channel length is shortened according to the proportional reduction rule, a threshold value of the transistor fluctuates greatly due to a minute change in the channel length, and also, a sub-threshold characteristic is deteriorated. Accordingly, there may occur problems such as an excessive increase of the threshold value for sufficiently restraining a standby current.

In addition, since a voltage applied to the transistor is not subject to the proportional reduction rule, an electrical characteristic required for a gate insulating film could not be obtained by using a silicon oxide film, so that a high-k dielectric film is used as the gate insulating film instead of the silicon oxide film. Here, the high-k dielectric film refers to a film having a dielectric constant greater than that of the silicon oxide film. The high-k dielectric film includes a silicon nitride film, a silicon oxynitride film, an aluminum oxide film, a tantalum oxide film, a hafnium oxide film, a zirconium oxide film and the like.

Moreover, the threshold value of the transistor is generally controlled by performing an ion implantation on a semiconductor substrate, or by using a work function difference between a gate electrode and the semiconductor substrate. In addition, a fixed charge is provided in the gate insulating film or an interface between the semiconductor substrate and the gate insulating film to control the threshold value of the transistor. When controlling the threshold value of the transistor by performing only the ion implantation, if the channel length becomes 0.2 microns or less, the threshold value considerably becomes nonuniform due to a statistical nonuniformity of the implanted ion. Therefore, it is desirable to use a combination of the above-described technologies for controlling the threshold value in a micro-MOSFET.

For instance, a pMOS having a structure shown in FIGS. 5a and 5b is described in Non-patent Document 1 or 2. In this pMOS, a film made of hafnium oxide ($HfO_2$) and aluminum oxide ($Al_2O_3$) is used as the gate insulating film, and the threshold value is controlled by using a gate structure having a stack of nickel silicided (Ni—FUSI) gate electrode /$Al_2O_3$/ $HfO_2$/Si. FIG. 5c shows a characteristic of a flat band voltage with respect to an equivalent oxide thickness (EOT), for each gate insulating film. The gate insulating films used here are $Al_2O_3$/$SiO_2$, Hf(20%)Al(80%)$O_x$/$SiO_2$, Hf(50%)Al(50%)$O_x$/$SiO_2$, Hf(80%)Al(20%)$O_x$/$SiO_2$, $HfO_2$/$SiO_2$, and $SiO_2$ as a reference.

In these cases, a $V_{fb}$ value increases as Al concentration increases, but this value is not appropriate for a pMOSFET of a CMOS circuit. In addition, in case of $Al_2O_3$, an effective work function equivalent value reaches only 4.8 eV, and particularly, in case of $HfO_2$, the value falls down to 4.6 eV. Thus, in case of using a high-k dielectric film starting with a $HfO_2$ film as the gate insulating film of the pMOSFET, it is difficult for the threshold value to be lowered (as an absolute value).

In addition, Patent Document 1 discloses a MOS transistor capable of stabilizing a threshold voltage and a flat band voltage by installing an intermediate layer, such as aluminum nitride or aluminum oxynitride, between a gate electrode containing silicon and a high-k gate dielectric material such as hafnium oxide, hafnium silicate or hafnium silicon oxynitride.

Further, Patent Document 2 discloses a MIS field-effect transistor having a laminated gate insulating film made of a hafnium aluminum oxide layer and a silicon oxynitride interface layer, capable of suppressing instability of a threshold voltage by removing a hysteresis characteristic of each layer.

Furthermore, Patent Document 3 discloses a MIS semiconductor device employing a laminated gate insulating film made of an aluminum oxide layer and a silicon oxide layer of zirconium or hafnium installed on a conductive channel.

Furthermore, Patent Document 4 discloses an NMOSFET provided with a gate insulating film, which is made of a silicon oxide film and a hafnium silicate film, and a gate electrode having an N-type polysilicon film formed on the gate insulating film. Also, disclosed is a PMOSFET provided with a gate insulating film, which is made of a silicon oxide film, a hafnium silicate film and an aluminum oxide film, and a gate electrode having a P-type polysilicon film formed on the gate insulating film.

Furthermore, Patent Document 5 discloses a method of controlling a threshold voltage by implanting Be, Al, Cr, Co, Cu, Ge, Au, In, Ir, Fe, Pb, Mn, Mo, Ni, Pd, Rh, Si, Ag, Ta, Tl, Ti, W, V or Zr into an insulating film formed on a semiconductor substrate.

However, the threshold voltage is not sufficiently controlled only through a combination of the above-described conventional techniques. For example, in case of the P-channel MOSFET employing the hafnium oxide film having a high dielectric constant as the gate insulating film, the threshold voltage shows a value equal to or less than (more than at absolute value) what is required for a circuit design. In Non-patent Document 1 or 2, the $HfO_2$ film is provided with $Al_2O_3$ to control the threshold voltage by using a work function difference, or a $V_{th}$ of the pMOS is controlled by forming a gate structure to a stack structure of gate electrode/$Al_2O_3$/ $HfO_2$/Si. The threshold voltage (or flat band voltage) can be shifted about 0.2V in comparison with the case of the $HfO_2$ film, but it does not meet the value required for the circuit design.

[Non-patent Document 1] M. Kadoshima et al., Symp. VLSI Tech. Dig., 2005, 70

[Non-patent Document 2] H. S. Jung et al., Symp. VLSI Tech. Dig., 2005, 232

[Patent Document 1] Japanese Patent Laid-open Application No. 2005-328059

[Patent Document 2] Japanese Patent Laid-open Application No. 2004-158498

[Patent Document 3] Japanese Patent Laid-open Application No. 2002-343965

[Patent Document 4] Japanese Patent Laid-open Application No. 2006-108439

[Patent Document 5] U.S. Pat. No. 4,297,782

BRIEF SUMMARY OF THE INVENTION

In view of the foregoing, the present disclosure provides a P-channel MOSFET having a gate threshold voltage suitable for a circuit design even if a high-k dielectric insulating film, which has a dielectric constant exceeding that of a silicon oxide film, is used as a gate insulating film when manufacturing a micro-MOSFET, and a method for manufacturing the same.

The present disclosure also provides a micro P-channel MOSFET capable of reducing a gate threshold voltage as an absolute value.

A MOS structure in accordance with an embodiment of the present invention includes a gate electrode/an insulating film containing aluminum and having a dielectric constant greater than that of a silicon oxide film/the silicon oxide film/a silicon substrate, and the MOS structure is provided with a diffusion layer formed by diffusing an aluminum atom or an aluminum ion to the silicon oxide film or an interface between the silicon oxide film and the silicon substrate by a heat treatment. Desirably, the silicon oxide film may have a thickness of about 5 nm or less.

More specifically, the MOS structure in accordance with an embodiment of the present invention includes a gate electrode/a laminated film or a mixed film of hafnium oxide and aluminum oxide/a silicon oxide film/a silicon substrate, and the MOS structure is provided with a diffusion layer formed by diffusing an aluminum atom or an aluminum ion from hafnium aluminate to the silicon oxide film or an interface between the silicon oxide film and the silicon substrate by a heat treatment. This structure is particularly appropriate for a P-channel MOSFET.

Further, the laminated film or the mixed film of hafnium oxide and aluminum oxide may be a hafnium aluminate film formed by alternately laminating the hafnium oxide and the aluminum oxide several times in a desired ratio. The hafnium aluminate film has a ratio of hafnium and aluminum ranging from about 2:8 to 8:2.

The heat treatment, diffusing the aluminum atom or the aluminum ion from the laminated film or the mixed film of hafnium oxide and aluminum oxide to the silicon oxide film or the interface between the silicon oxide film and the silicon substrate, is desirably performed at a temperature from about 500 to 1000° C. for a period of time from about 1 to 100 seconds after forming a metal film or a fully silicided film as the gate electrode. This employs a shift phenomenon of a flat band voltage in a positive direction ($V_{fb}$ roll-up phenomenon) by diffusing the aluminum by means of an annealing.

The semiconductor device can be manufactured by following processes.

(1) A device isolation region is formed in a silicon substrate.
(2) A cleaning process is performed on a surface of the silicon substrate. It is desirable that a natural oxide film on the surface is removed.
(3) The surface is oxidized to form a thin (for example, about 1 nm) oxide film thereon.
(4) Formed is a laminated film or a mixed film of hafnium oxide and aluminum oxide as an insulating film containing aluminum and having a dielectric constant greater than that of the silicon oxide film.
(5) A heat treatment is performed at any temperature from about 500 to 1000° C. for any period of time from about 1 to 100 seconds. This heat treatment may be performed in a following step (7).
(6) A conductive film for a gate electrode is formed. At this time, it is desirable not to use a P-type polysilicon film because the P-type polysilicon film may change a threshold voltage of a transistor.
(7) A heat treatment is performed at any temperature from about 500 to 1000° C. for any period of time from about 1 to 100 seconds under a non-oxidizing atmosphere. This heat treatment may be performed in the aforementioned step (5).
(8) The gate electrode is patterned by lithography.
(9) A source/drain diffusion layer region is formed.
(10) A metal interconnection is formed.

A gate threshold voltage can be easily controlled by using the insulating film having a high dielectric constant or by an ion implantation from the conductive film for the gate electrode or by the heat treatment.

BRIEF DESCRIPTION OF THE DRAWINGS

The disclosure may best be understood by reference to the following description taken in conjunction with the following figures.

DETAILED DESCRIPTION OF THE INVENTION

Figure 1:
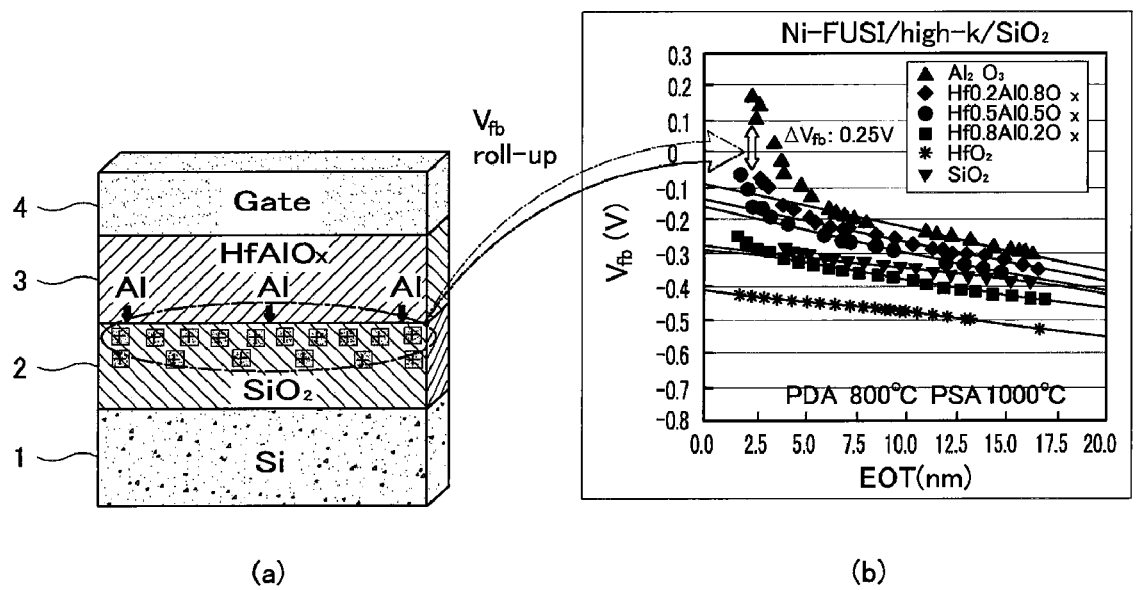
FIGS. 1a and 1b show a MOS capacitor and a flat band voltage characteristic thereof in accordance with an embodiment of the present invention.

First, an interface layer, which is made of a silicon oxide ($SiO_2$) film having a thickness distribution, is formed on a P-type silicon wafer to measure a flat band voltage by using a MOS capacitor having a structure shown in FIG. 1a. Here, the thickness distribution is provided to enable measurement, and a uniform thickness is more desirable. Then, a hafnium aluminate ($HfAlO_x$) layer as a gate insulating film is formed by a MOCVD method (metal organic chemical vapor deposition method). Thereafter, a heat treatment (PDA : post $Al_2O_3$ deposition annealing), which controls the diffusion of Al from the $HfAlO_x$ film to the interface ($SiO_2$), is performed at a temperature of about 600° C. to 1000° C. for a predetermined time of about 1 second to 100 seconds. Subsequently, tungsten (W) or nickel silicide (FUSI—$NiSi_x$) film, which is a gate electrode, is formed. Finally, an annealing process is performed at a temperature of about 400° C. under a hydrogen gas ($H_2$) atmosphere. Here, the gate insulating film is $Al_2O_3$/$SiO_2$, Hf(20%)Al(80%)$O_x$/$SiO_2$, Hf(50%)Al(50%)$O_x$/$SiO_2$, Hf(80%)Al(20%)$O_x$/$SiO_2$, $HfO_2$/$SiO_2$, and $SiO_2$ as a reference.

Accordingly, as shown in FIG. 1b, a desirable device characteristic controlling the flat band voltage ($V_{fb}$) can be obtained. FIG. 1b shows a case in which the PDA is performed at a temperature of about 800° C. and an annealing (PSA: Post Si Deposition Annealing) after forming the gate electrode is performed at a temperature of about 1000° C. As can be seen from FIG. 1b, if an EOT is about 7 nm or less; about 5 nm or less; about 3.5 nm or less; or about 2.5 nm or less when the gate insulating film is $Al_2O_3/SiO_2$; Hf(20%)Al(80%)$O_x$/$SiO_2$; Hf(50%)Al(50%)$O_x$/$SiO_2$; or Hf(80%)Al(20%)$O_x$/$SiO_2$, respectively, a roll-up phenomenon of the flat band voltage occurs so that respective $V_{fb}$ increases. However, when the gate insulating film is $HfO_2/SiO_2$, or $SiO_2$ as a reference, the roll-up phenomenon does not occur.

These results are caused by one inventive feature of the present invention, which means that the Al element is diffused from the $HfAlO_x$ high-k dielectric film to the $SiO_2$ interface layer, and also, a $V_{th}$ of a pMOS transistor can be controlled by a formed bulk charge. These characteristics are effective in manufacturing a pMOS device having a low power consumption.

Figure 2:
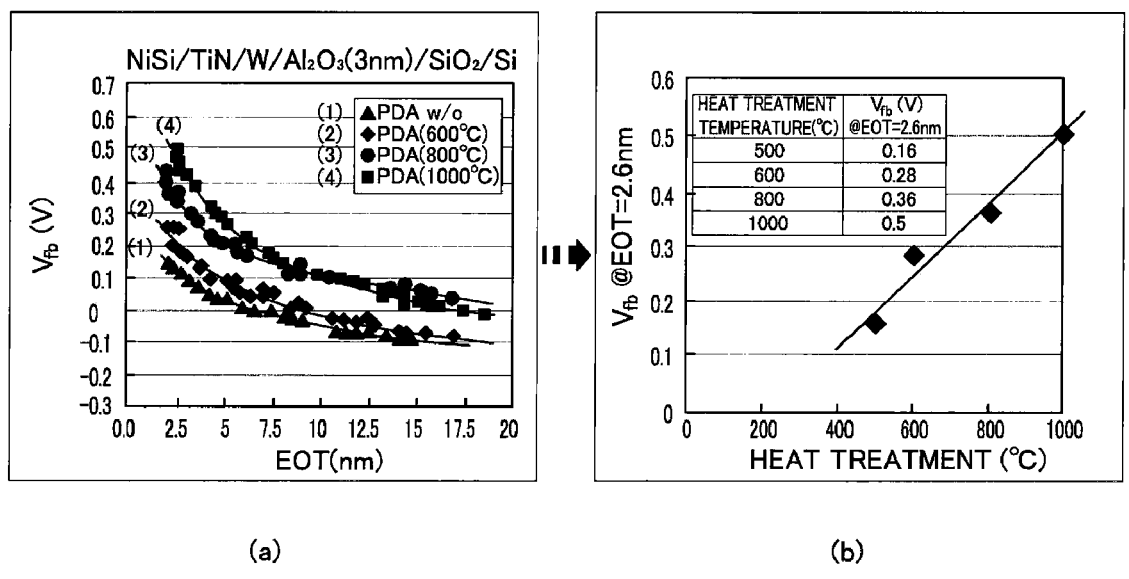
FIGS. 2a and 2b show a roll-up phenomenon of a flat band voltage.

FIG. 2a shows a roll-up phenomenon depending on the PDA temperature when a gate insulating film is $Al_2O_3/SiO_2$. In addition, FIG. 2b shows a flat band voltage depending on the PDA temperature when an EOT of a gate insulating film is about 2.6 nm. If the PDA temperatures are about 500° C., 600° C., 800° C. and 1000° C., the flat band voltages are about 0.16V, 0.28V, 0.36V and 0.5V, respectively. From these results, it could be seen that the PDA temperature can control the flat band voltage.

Figure 3:
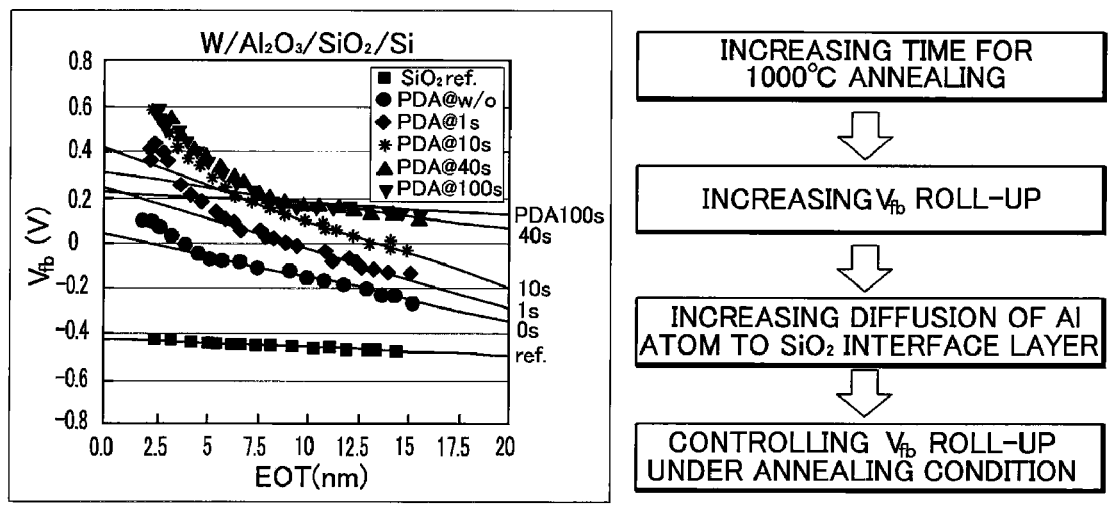
FIGS. 3a and 3b show a roll-up phenomenon of a flat band voltage dependent on a period of time for performing an annealing (PDA) after forming an alumina film.
Figure 4:
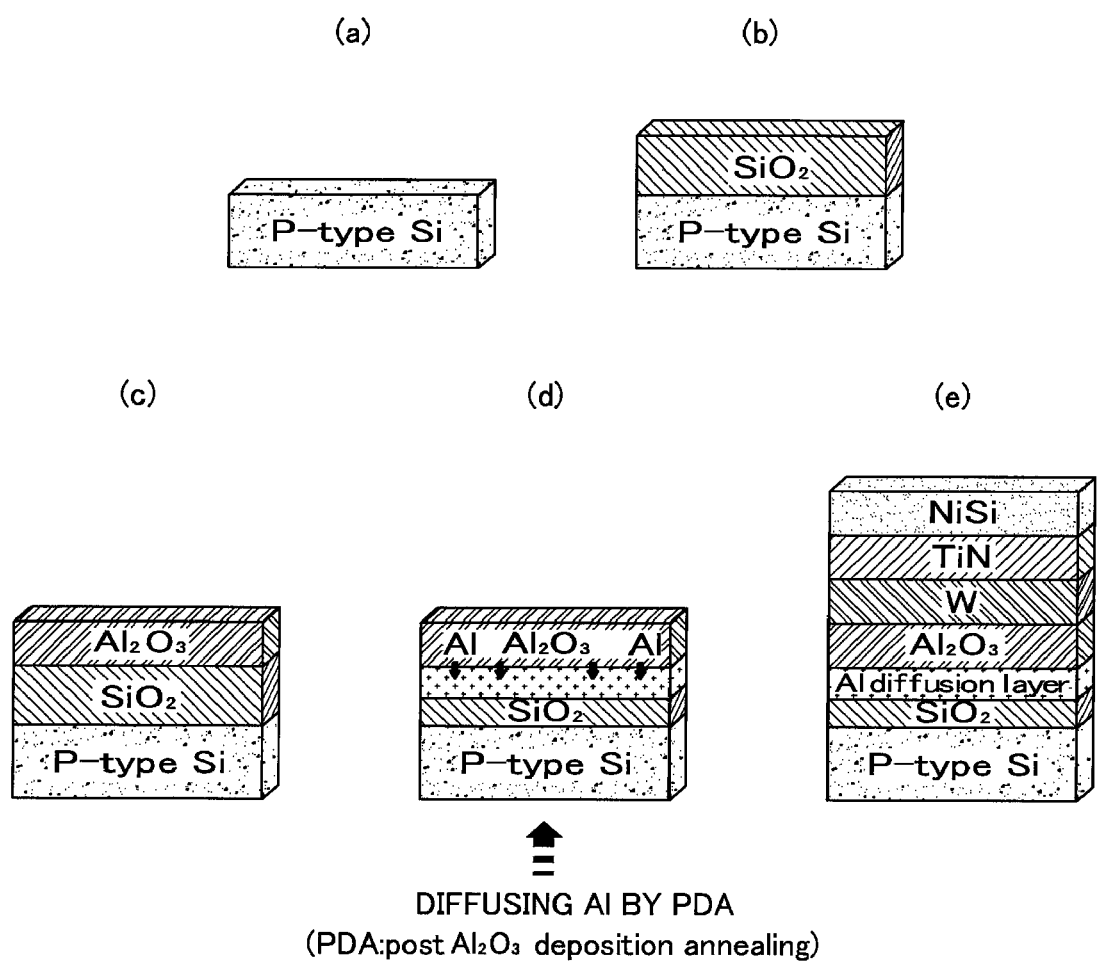
FIGS. 4a to 4e show process steps of preparing a sample for measuring a flat band voltage.
Figure 5:
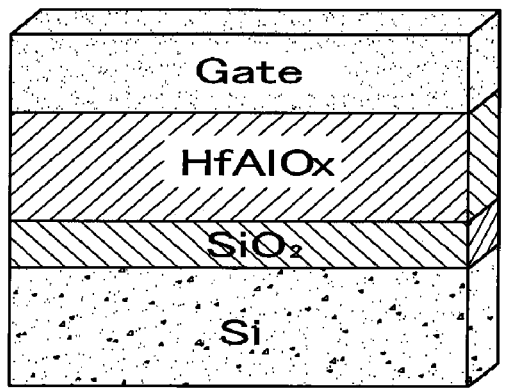
FIGS. 5a to 5c show a characteristic of a flat band voltage with respect to an equivalent oxide thickness (EOT), in a gate structure made of nickel silicided (Ni—FUSI) gate electrode/$Al_2O_3$/$HfO_2$/Si.
Figure 5:
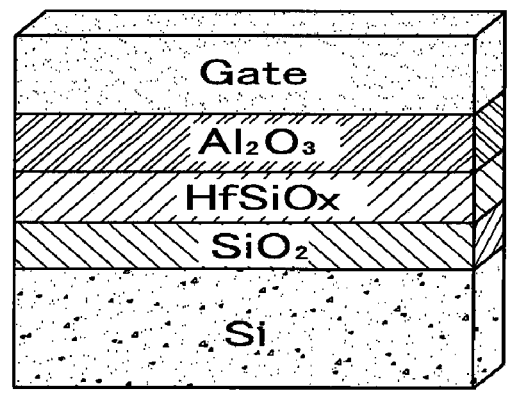
Figure 5:
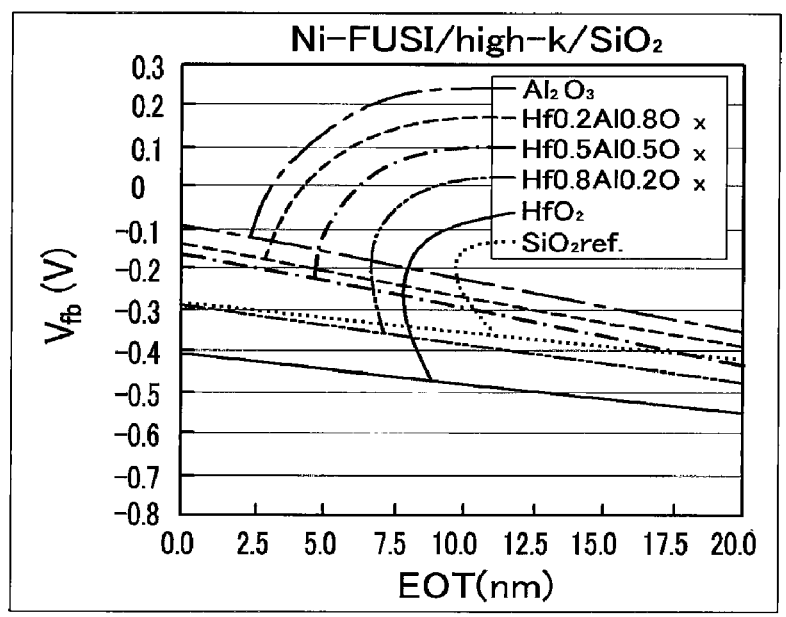

In addition, FIG. 3a shows a flat band voltage depending on a period of time (about 1 second, 10 seconds, 40 seconds and 100 seconds) for performing a PDA when a gate electrode is tungsten, a high-k dielectric insulating film is $Al_2O_3$ and a gate structure is made of W/$Al_2O_3$/$SiO_2$/Si. When a gate insulating film is exclusively made of $SiO_2$, a roll-up phenomenon is not observed, but the roll-up occurs noticeably when the PDA is performed for more than 1 second. When the PDA is not performed, the roll-up phenomenon occurs minutely due to another heat treatment.

Further, FIGS. 4a to 4e show a manufacturing process of a sample used for the measurement in FIG. 3a.
(a) A cleaning process is performed on a surface of a substrate.
(b) The surface is oxidized to form a thin oxide film thereon.
(c) An $Al_2O_3$ film is formed.
(d) The PDA is performed at a temperature of about 1000° C. for a predetermined time of about 1 second to 100 seconds, so that aluminum atom is diffused. The aluminum in the silicon oxide film is present as an atom or an ion.
(e) W and TiN are formed as a gate electrode, and a poly-Si is formed thereon. Then, the gate electrode is patterned by lithography.

A MOS transistor can be manufactured through a process as follows. However, a well known process for forming a well region will be omitted herein.
(1) A device isolation region is formed in a silicon substrate.
(2) A cleaning process is performed on a surface of the silicon substrate. It is desirable that a natural oxide film on the surface is removed.
(3) The surface is oxidized to form a thin (for example, about 1 nm) oxide film thereon.
(4) Formed is a laminated film or a mixed film of hafnium oxide and aluminum oxide as an insulating film containing aluminum and having a dielectric constant greater than that of the silicon oxide film.
(5) A heat treatment is performed at any temperature from about 500 to 1000° C. for any period of time from about 1 to 100 seconds. This heat treatment may be performed in a following step (7).
(6) A conductive film for a gate electrode is formed. At this time, it is desirable not to use a P-type polysilicon film because the P-type polysilicon film may change a threshold voltage of a transistor.
(7) A heat treatment is performed at any temperature from about 500 to 1000° C. for any period of time from about 1 to 100 seconds under a non-oxidizing atmosphere. This heat treatment may be performed in the aforementioned step (5).
(8) The gate electrode is patterned by lithography.
(9) A source/drain diffusion layer region is formed.
(10) A metal interconnection is formed.

The present invention is not limited to the P-channel device, but the flat band voltage can be controlled in an N-channel device as well. Accordingly, the present invention can be applicable to a threshold voltage of a gate in an N-channel MOSFET.

The above description of the present invention is provided for the purpose of illustration, and it would be understood by those skilled in the art that various changes and modifications may be made without changing the technical conception and essential features of the present invention. Thus, it is clear that the above-described embodiments are illustrative in all aspects and do not limit the present invention.

The scope of the present invention is defined by the following claims rather than by the detailed description of the embodiment. It shall be understood that all modifications and embodiments conceived from the meaning and scope of the claims and their equivalents are included in the scope of the present invention.

What is claimed is:

1. A semiconductor device, comprising:
   a MOS transistor including a gate structure formed by sequentially laminating a silicon oxide film having a thickness of about 5 nm or less, an insulating film containing aluminum and having a dielectric constant greater than that of the silicon oxide film, and a gate electrode on a silicon substrate, and a source region and a drain region formed by a impurity diffusion layer,
   wherein the MOS transistor is provided with a layer formed by diffusing an aluminum atom or an aluminum ion from the insulating film containing aluminum and having a dielectric constant greater than that of the silicon oxide film to the silicon oxide film or an interface between the silicon oxide film and the silicon substrate by a heat treatment.

2. The semiconductor device of claim 1, wherein the MOS transistor is a P-channel MOSFET, and the insulating film containing aluminum and having a dielectric constant greater than that of the silicon oxide film is a laminated film or a mixed film of hafnium oxide and aluminum oxide.

3. The semiconductor device of claim 2, wherein the gate electrode is a metal film or a metal silicide film,
   the heat treatment, diffusing the aluminum atom or the aluminum ion from the laminated film or the mixed film of hafnium oxide and aluminum oxide to the silicon oxide film or the interface between the silicon oxide film and the silicon substrate, is additionally performed at any temperature from about 500 to 1000° C. for any period of time from about 1 to 100 seconds after forming the gate electrode, and
   the aluminum atom or the aluminum ion is diffused by the heat treatment so that a roll-up phenomenon of a flat band voltage ($V_{fb}$) occurs.

4. The semiconductor device of claim 2, wherein the mixed film of hafnium oxide and aluminum oxide is a hafnium aluminate film formed by alternately laminating the hafnium oxide and the aluminum oxide in a predetermined ratio.

5. The semiconductor device of claim 4, wherein the hafnium aluminate film has a ratio of hafnium and aluminum ranging from about 2:8 to 8:2.

* * * * *